(12) United States Patent
Hwang et al.

(10) Patent No.: US 12,046,323 B2
(45) Date of Patent: Jul. 23, 2024

(54) SEMICONDUCTOR DEVICE AND SEMICONDUCTOR SYSTEM

(71) Applicant: SK hynix Inc., Icheon-si (KR)

(72) Inventors: Jeong Jin Hwang, Icheon-si (KR); Sung Nyou Yu, Icheon-si (KR); Min Jun Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 232 days.

(21) Appl. No.: 17/741,099

(22) Filed: May 10, 2022

(65) Prior Publication Data
US 2023/0223061 A1    Jul. 13, 2023

(30) Foreign Application Priority Data

Jan. 12, 2022 (KR) .................. 10-2022-0004839

(51) Int. Cl.
*G11C 8/10*   (2006.01)
*G11C 8/08*   (2006.01)

(52) U.S. Cl.
CPC . *G11C 8/08* (2013.01); *G11C 8/10* (2013.01)

(58) Field of Classification Search
CPC ....................................................... G11C 8/10
See application file for complete search history.

(56) References Cited

U.S. PATENT DOCUMENTS

| | | | | |
|---|---|---|---|---|
| 5,793,695 A | * | 8/1998 | Kohno | G11C 8/10 365/189.11 |
| 2002/0003279 A1 | * | 1/2002 | Lee | G11C 29/70 257/529 |
| 2004/0156260 A1 | * | 8/2004 | Lee | G11C 16/08 365/230.06 |
| 2004/0252558 A1 | * | 12/2004 | Umezawa | G11C 8/08 365/189.11 |
| 2006/0044924 A1 | * | 3/2006 | Wada | G11C 11/4074 365/230.06 |
| 2008/0198684 A1 | * | 8/2008 | Sakamoto | G11C 8/06 365/230.08 |
| 2014/0098600 A1 | * | 4/2014 | Kim | G11C 11/1655 365/158 |

FOREIGN PATENT DOCUMENTS

KR    1019930010998 A    6/1993
KR    1020140095941 A    8/2014

* cited by examiner

*Primary Examiner* — Douglas King
(74) *Attorney, Agent, or Firm* — WILLIAM PARK & ASSOCIATES LTD.

(57) ABSTRACT

A semiconductor device includes an address input circuit configured to boost a voltage level of at least one bit of a row address to generate a boosting address and to drive a signal of a first node based on other bits of the row address and the boosting address. The semiconductor device also includes a word line selection signal generation circuit configured to drive a signal of a second node based on the signal of the first node and to generate a word line selection signal for selecting a word line based on the signal of the second node.

23 Claims, 11 Drawing Sheets

(VTEMP > VREF , COLD)

SEMICONDUCTOR DEVICE AND SEMICONDUCTOR SYSTEM

CROSS-REFERENCE TO RELATED APPLICATIONS

The present application claims priority under 35 U.S.C. 119(a) to Korean Patent Application No. 10-2022-0004839, filed on Jan. 12, 2022, which is incorporated herein by reference in its entirety.

BACKGROUND

1. Technical Field

Embodiments of the present disclosure relate to a semiconductor device and a semiconductor system including the semiconductor device.

2. Related Art

A semiconductor device performs a row operation or a column operation to store data in a memory cell array or output the data stored in the memory cell array. The row operation may be performed in such a way that a row address is decoded and at least one of word lines included in the memory cell array is selected. The column operation may be performed in such a way that a column address is decoded and at least one of bit lines included in the memory cell array is selected.

SUMMARY

In accordance with an embodiment of the present disclosure is a semiconductor device including an address input circuit configured to boost a voltage level of at least one bit of a row address to generate a boosting address and to drive a signal of a first node based on other bits of the row address and the boosting address. The semiconductor device also includes a word line selection signal generation circuit configured to drive a signal of a second node based on the signal of the first node and to generate a word line selection signal for selecting a word line based on the signal of the second node.

In accordance with another embodiment of the present disclosure is a semiconductor device including an address input circuit configured to generate a first boosting address and a second boosting address based on at least one bit of a row address, to drive a signal of a first node based on other bits of the row address and the first boosting address, and to drive a signal of a second node based on the row address and the second boosting address. The semiconductor device also includes a first word line selection signal generation circuit configured to drive a signal of a third node based on the signal of the first node and to generate a first word line selection signal for selecting a first word line based on the signal of the third node. The semiconductor device further includes a second word line selection signal generation circuit configured to drive a signal of a fourth node based on the signal of the second node and to generate a second word line selection signal for selecting a second word line based on the signal of the fourth node.

In accordance with an additional embodiment of the present disclosure is a semiconductor system including a controller configured to output an external control signal. The semiconductor system also includes a semiconductor device. The semiconductor device is configured to boost a voltage level of at least one bit of a row address generated based on the external control signal to generate a boosting address, drive a signal of a first node based on other bits of the row address and the boosting address, drive a signal of a second node based on the signal of the first node, and generate a word line selection signal for selecting a word line based on the signal of the second node.

DETAILED DESCRIPTION OF THE EMBODIMENTS

In the following description of embodiments, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" may mean a combination of logic levels of bits included in a signal. When the logic level of each of the bits included in the signal is changed, the logic bit set of the signal may be set differently. For example, when the signal includes 2 bits, when the logic level of each of the 2 bits included in the signal is "logic low level, logic low level," the logic bit set of the signal may be set as the first logic bit set, and when the logic level of each of the two bits included in the signal is "logic low level, logic high level," the logic bit set of the signal may be set as the second logic bit set.

Various embodiments of the present disclosure will be described hereinafter in detail with reference to the accompanying drawings. However, the embodiments described herein are for illustrative purposes only and are not intended to limit the scope of the present disclosure.

Figure 1:
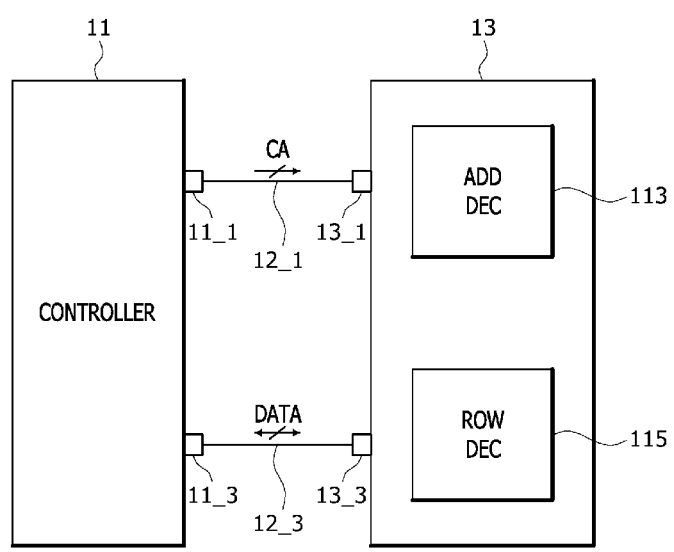
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As illustrated in FIG. 1, the semiconductor system 1 may include a controller 11 and a semiconductor device 13.

The controller 11 may include a first control pin 11_1 and a second control pin 11_3. The semiconductor device 13 may include a first device pin 13_1 and a second device pin 13_3. The controller 11 may transmit an external control signal CA to the semiconductor device 13 through a first transmission line 12_1 connected between the first control pin 11_1 and the first device pin 13_1. In this embodiment, the external control signal CA may include a command and an address, but this is only an example and the present disclosure is not limited thereto. Each of the first control pin 11_1, the first transmission line 12_1, and the first device pin 13_1 may be implemented in plurality according to the number of bits of the external control signal CA. The controller 11 may transmit data DATA to the semiconductor device 13 through a second transmission line 12_3 connected between the second control pin 11_3 and the second device pin 13_3. The controller 110 may receive data DATA through the second transmission line 12_3 connected between the second control pin 11_3 and the second device pin 13_3.

The semiconductor device 13 may include an address decoder (ADD DEC) 113 that decodes the external control signal CA to generate a row address (RADD of FIG. 2) for a row operation and a column address (CADD of FIG. 2) for a column operation. The row operation may include an active operation, and the column operation may include a read operation and a write operation. The semiconductor device 13 may include a row decoder (ROW DEC) 115 that controls the row operation of selecting at least one of word lines included in a memory cell array (117 of FIG. 2), based on the row address (RADD of FIG. 2).

Figure 2:
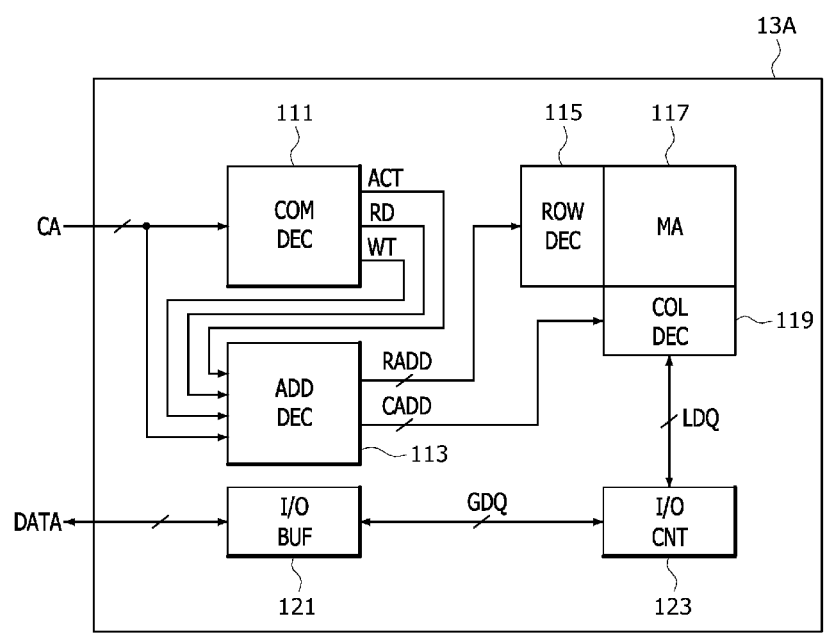
FIG. 2 is a block diagram illustrating a configuration of a semiconductor device according to an embodiment of the present disclosure.

FIG. 2 is a block diagram illustrating a configuration of a semiconductor device 13A according to an embodiment of the present disclosure. As illustrated in FIG. 2, the semiconductor device 13A may include a command decoder (COM DEC) 111, an address decoder (ADD DEC) 113, a row decoder (ROW DEC) 115, a memory cell array (MA) 117, a column decoder (COL DEC) 119, an input/output buffer (I/O BUF) 121, and an input/output control circuit (I/O CNT) 123.

The command decoder 111 may generate an active signal ACT, a read signal RD, and a write signal WT. The command decoder 111 may decode a command included in an external control signal CA to generate the active signal ACT, the read signal RD, and the write signal WT. The command decoder 111 may generate the active signal ACT that is activated in an active operation when bits included in the external control signal CA have a first logic bit set. The command decoder 111 may generate the read signal RD that is activated in a read operation when the bits included in the external control signal CA have a second logic bit set. The command decoder 111 may generate the write signal WT that is activated in a write operation when the bits included in the external control signal CA have a third logic bit set. Each of the first logic bit set, the second logic bit set, and the third logic bit set of the external control signal CA may be set in various ways according to embodiments.

The address decoder 113 may decode the external control signal CA to generate a row address RADD for a row operation and a column address CADD for a column operation. The row operation may include an active operation, and the column operation may include a read operation and a write operation.

The row decoder 115 may select at least one of word lines included in the memory cell array 117, based on the row address RADD. The column decoder 119 may select at least one of bit lines included in the memory cell array 117, based on the column address CADD.

The input/output buffer 121 may buffer the data DATA to generate global data GDQ when a write operation is performed. The input/output control circuit 123 may receive the global data GDQ from the input/output buffer 121 when the write operation is performed. The input/output control circuit 123 may generate local data LDQ to be stored in the memory cell array 117 from the global data GDQ when the write operation is performed. The input/output control circuit 123 may generate the global data GDQ from the local data LDQ output from the memory cell array 117 when a read operation is performed. The input/output buffer 121 may receive the global data GDQ from the input/output control circuit 123 when the read operation is performed. The input/output buffer 121 may buffer the global data GDQ to output the data DATA when the read operation is performed.

Figure 3:
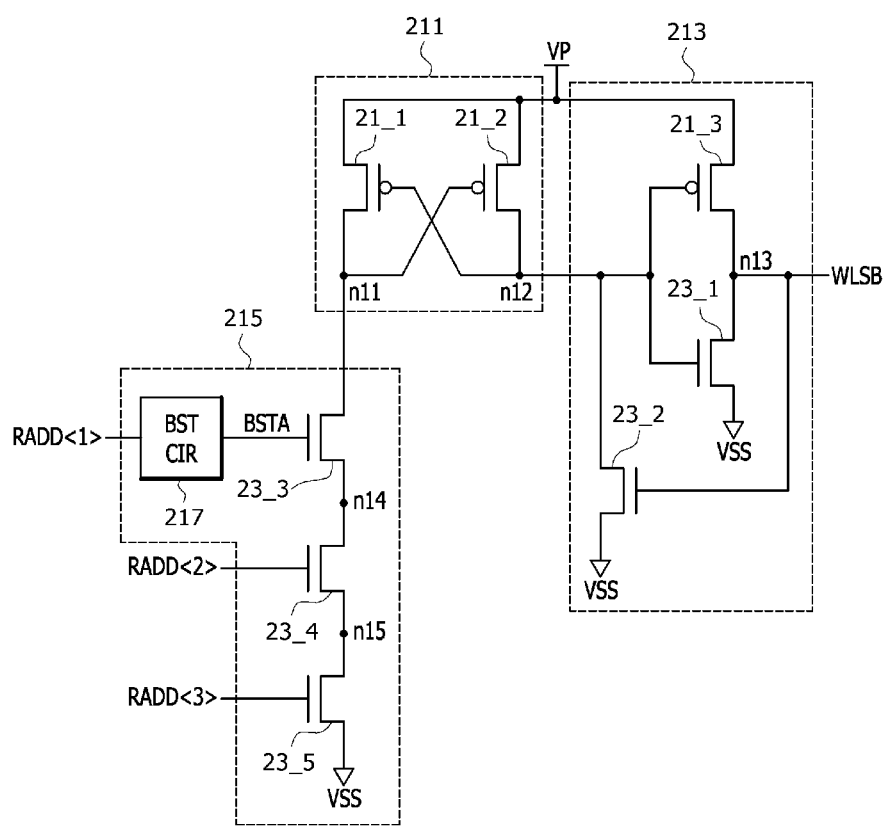
FIG. 3 is a diagram illustrating a configuration of a row decoder according to an embodiment of the present disclosure.

FIG. 3 is a diagram illustrating a configuration of a row decoder 115A according to an embodiment of the present disclosure. As illustrated in FIG. 3, the row decoder 115A may include a voltage setting circuit 211, a word line selection signal generation circuit 213, and an address input circuit 215.

The voltage setting circuit 211 may include a first PMOS transistor 21_1 and a second PMOS transistor 21_2. The first PMOS transistor 21_1 may be connected between a supply terminal of a source power VP and a first node n11, and may be turned on based on a signal of a second node n12. The source power VP may be generated by pumping the power applied from the controller (11 of FIG. 1). The second PMOS transistor 21_2 may be connected between the supply terminal of the source power VP and the second node n12, and may be turned on based on a signal of the first node n11.

The voltage setting circuit 211 may initialize the signal of the second node n12 to a logic "low" level by a word line selection signal WLSB initialized to a logic "high" level, and may initialize the signal of the first node n11 to a logic "high" level by the signal of the second node n12 of a logic "low" level. The voltage setting circuit 211 may drive the second node n12 to a logic "high" level by the first node n11 driven to a logic "low" level when first to third bits RADD<1:3> of a row address having a preset logic bit set are input through the address input circuit 215.

The word line selection signal generation circuit 213 may include a third PMOS transistor 21_3, a fourth NMOS transistor 23_1, and a fifth NMOS transistor 23_2. The third PMOS transistor 21_3 may be connected between the supply terminal of the source power VP and a fifth node n13, and may be turned on based on the signal of the second node n12. The fourth NMOS transistor 23_1 may be connected between the fifth node n13 and a supply terminal of a ground voltage VSS, and may be turned on based on the signal of the second node n12. The fifth NMOS transistor 23_2 may be connected between the second node n12 and the supply terminal of the ground voltage VSS, and may be turned on based on a signal of the fifth node n13. The word line selection signal generation circuit 213 may drive the second node n12 to a logic "low" level by the word line selection signal WLSB initialized to a logic "high" level. The word line selection signal WLSB may be driven to a logic "high" level by a reset signal (not shown) during an initialization operation. The word line selection signal generation circuit 213 may drive the word line selection signal WLSB to a logic "high" level when the second node n12 is in a logic "low" level. The word line selection signal generation circuit 213 may drive the word line selection signal WLSB to a logic "low" level when the first to third bits RADD<1:3> of the row address having a preset logic bit set are input through the address input circuit 215, the first node n11 is driven to a logic "low" level, and the second node n12 is driven to a logic "high" level. At least one of the word lines included in the memory cell array (117 of FIG. 2) may be selected by the word line selection signal WLSB driven to a logic "low" level. The word line selected in the word line selection signal generation circuit 213 may include a main word line and a sub word line. The word line selection signal generation circuit 213 may be used as a circuit for driving the word lines.

The address input circuit 215 may include a boosting circuit (BST CIR) 217, a first NMOS transistor 23_3, a second NMOS transistor 23_4, and a third NMOS transistor 23_5. The boosting circuit 217 may boost the first bit RADD<1> of the row address to generate a boosting address BSTA. The boosting address BSTA may be generated at a higher voltage level than the first bit RADD<1> of the row address. For example, the boosting circuit 217 may generate the boosting address BSTA having the same logic level as the first bit RADD<1> of the row address. According to an embodiment, the boosting circuit 217 may be implemented to generate the boosting address BSTA having an inverted logic level from the first bit RADD<1> of the row address. The first NMOS transistor 23_3 may be connected between the first node n11 and a third node n14, and may be turned-on based on the boosting address BSTA. For example, the first NMOS transistor 23_3 may be turned-on when the first bit RADD<1> of the row address is at a logic "high" level. The second NMOS transistor 23_4 may be connected between the third node n14 and a fourth node n15, and may be turned-on based on the second bit RADD<2> of the row address. For example, the second NMOS transistor 23_4 may be turned-on when the second bit RADD<2> of the row address is at a logic "high" level. The third NMOS transistor 23_5 may be connected between the fourth node n15 and the supply terminal of the ground voltage VSS, and may be turned-on based on the third bit RADD<3> of the row address. For example, the third NMOS transistor 23_5 may be turned-on when the third bit RADD<3> of the row address is at a logic "high" level.

The first NMOS transistor 23_3 may be formed to include a thicker gate oxide layer than the second NMOS transistor 23_4 and the third NMOS transistor 23_5 or to include a gate oxide layer having a high dielectric constant. Because a threshold voltage of the first NMOS transistor 23_3 is set to be greater than a threshold voltage of each of the second NMOS transistor 23_4 and the third NMOS transistor 23_5, a leakage current generated in the turned-off first NMOS transistor 23_3 may be reduced. Because the first NMOS transistor 23_3 is turned-on by the boosting address BSTA generated at a higher voltage level than the first bit RADD<1> of the row address, a sufficient gate voltage can be secured even in a low-speed operation state. Accordingly, turn-on timing may be prevented from being delayed, and a timing difference between the row operation and the column operation may be sufficiently secured to prevent deterioration of the row operation and the column operation. The low-speed operation state may include a state in which process conditions are slow, a state in which the voltage level of power supplied from the controller (11 in FIG. 1) is low, and a low temperature state.

The address input circuit 215 may drive the first node n11 to a logic "low" level when the first to third bits RADD<1:3> of the row address have a preset logic bit set. For example, in the preset logic bit set of the first to third bits RADD<1:3> of the row address, the first bit RADD<1> of the row address, the second bit RADD<2> of the row address, and the third bit RADD<3> of the row address may all be set to a logic "high" level, but this is only an example and the present disclosure is not limited thereto.

Figure 4:
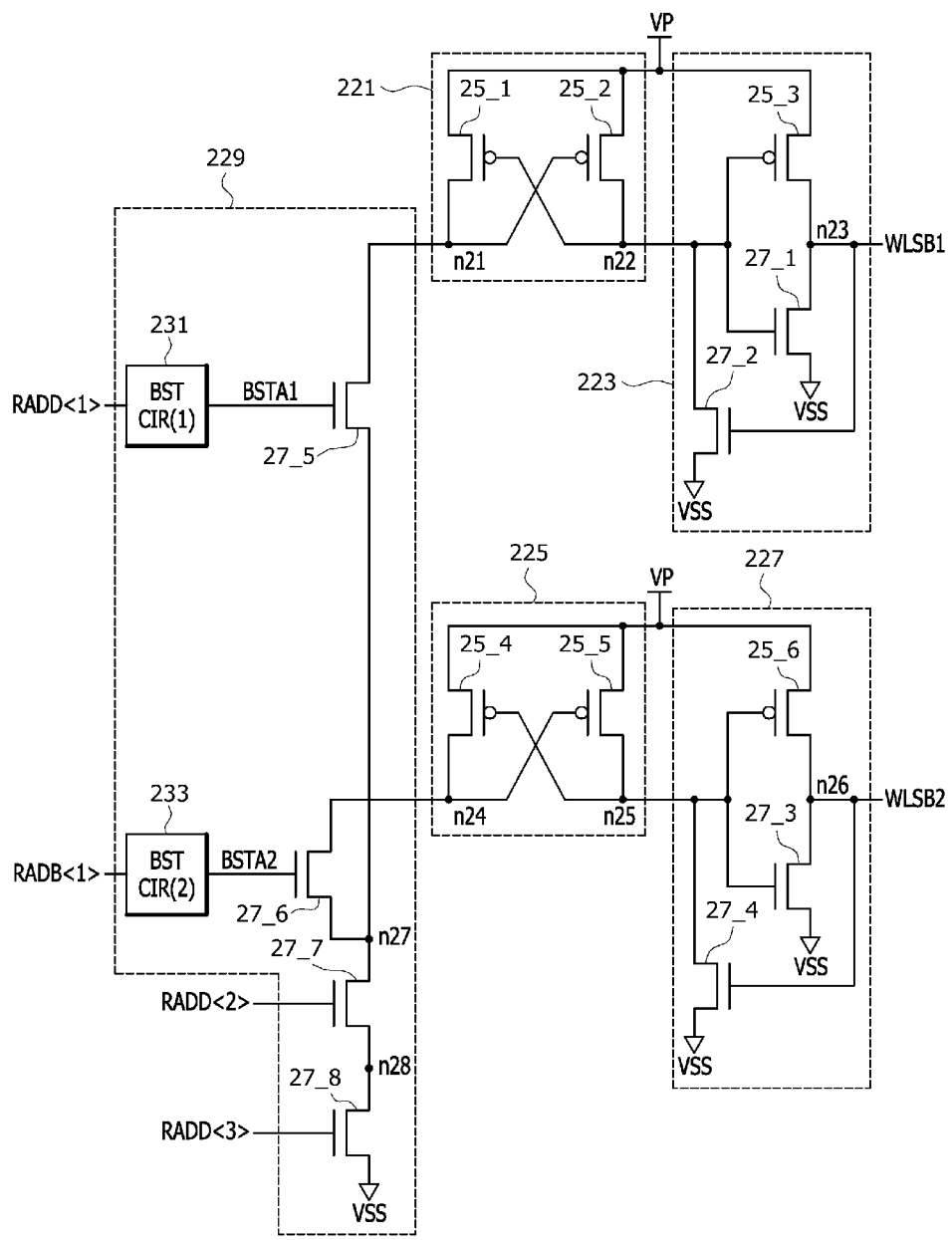
FIG. 4 is a diagram illustrating a configuration of a row decoder according to another embodiment of the present disclosure.

FIG. 4 is a diagram illustrating a configuration of a row decoder 115B according to an embodiment of the present disclosure. As illustrated in FIG. 4, the row decoder 115B may include a first voltage setting circuit 221, a first word line selection signal generation circuit 223, a second voltage setting circuit 225, a second word line selection signal generation circuit 227, and an address input circuit 229.

The first voltage setting circuit 221 may include a first PMOS transistor 25_1 and a second PMOS transistor 25_2. The first PMOS transistor 25_1 may be connected between a supply terminal of a source power VP and a first node n21, and may be turned-on based on a signal of a third node n22. The second PMOS transistor 25_2 may be connected between the supply terminal of the source power VP and the third node n22, and may be turned-on based on a signal of the first node n21. The first voltage setting circuit 221 may initialize the signal of the third node n22 to a logic "low" level by a first word line selection signal WLSB1 initialized to a logic "high" level, and may initialize the signal of the first node n21 to a logic "high" level by the signal of the third node n22 of the logic "low" level. The first voltage setting circuit 221 may drive the third node n22 to a logic "high" level by the first node n21 driven to a logic "low" level when first to third bits RADD<1:3> of a row address having a preset first logic bit set are input through the address input circuit 229.

The first word line selection signal generation circuit 223 may include a third PMOS transistor 25_3, a fifth NMOS transistor 27_1, and a sixth NMOS transistor 27_2. The third PMOS transistor 25_3 may be connected between a supply terminal of a source power VP and a seventh node n23, and may be turned-on based on the signal of the third node n22. The fifth NMOS transistor 27_1 may be connected between the seventh node n23 and a supply terminal of a ground voltage VSS, and may be turned-on by the signal of the third node n22. The sixth NMOS transistor 27_2 may be connected between the third node n22 and the supply terminal of the ground voltage VSS, and may be turned-on based on a signal of the seventh node n23. The first word line selection signal generation circuit 223 may drive the third node n22 to a logic "low" level by the first word line selection signal WLSB1 initialized to a logic "high" level. The first word line selection signal WLSB1 may be driven to a logic "high" level by a reset signal (not shown) during an initialization operation. The first word line selection signal generation circuit 223 may drive the first word line selection signal WLSB1 to a logic "high" level when the third node n22 is at a logic "low" level. The first word line selection signal generation circuit 223 may drive the first word line selection signal WLSB1 to a logic "low" level when the first to third bits RADD<1:3> of the row address having a preset first logic bit set are input through the address input circuit 229, the first node n21 is driven to a logic "low" level, and the third node n22 is driven to a logic "high" level. At least one of the word lines included in the memory cell array (117 of FIG. 2) may be selected by the first word line selection signal WLSB1 driven to a logic "low" level.

The second voltage setting circuit 225 may include a fourth PMOS transistor 25_4 and a fifth PMOS transistor 25_5. The fourth PMOS transistor 25_4 may be connected between the supply terminal of the source power VP and a second node n24, and may be turned-on based on a signal of a fourth node n25. The fifth PMOS transistor 25_5 may be connected between the supply terminal of the source power VP and the fourth node n25, and may be turned-on based on a signal of the second node n24. The second voltage setting circuit 225 may initialize the signal of the fourth node n25 to a logic "low" level by a second word line selection signal WLSB2 initialized to a logic "high" level, and may initialize the signal of the second node n24 to a logic "high" level by the signal of the fourth node n25 of a logic "low" level. The second voltage setting circuit 225 may drive the fourth node n25 to a logic "high" level by the second node n24 driven to a logic "low" level when the first to third bits RADD<1:3> of the row address having a predetermined second logic bit set are input through the address input circuit 229.

The second word line selection signal generation circuit 227 may include a sixth PMOS transistor 25_6, a seventh NMOS transistor 27_3, and a eighth NMOS transistor 27_4. The sixth PMOS transistor 25_6 may be connected between the supply terminal of the source power VP and an eighth node n26, and may be turned-on based on the signal of the fourth node n25. The seventh NMOS transistor 27_3 may be connected between the eighth node n26 and the supply terminal of the ground voltage VSS, and may be turned-on by the signal of the fourth node n25. The eighth NMOS transistor 27_4 may be connected between the fourth node n25 and the supply terminal of the ground voltage VSS, and may be turned-on based on a signal of the eighth node n26. The second word line selection signal generation circuit 227 may drive the fourth node n25 to a logic "low" level by the second word line selection signal WLSB2 initialized to a logic "high" level. The second word line selection signal WLSB2 may be driven to a logic "high" level by the reset signal (not shown) during the initialization operation. The second word line selection signal generation circuit 227 may drive the second word line selection signal WLSB2 to a logic "high" level when the fourth node n25 is at a logic "low" level. The second word line selection signal generation circuit 227 may drive the second word line selection signal WLSB2 to a logic "low" level when the first to third bits RADD<1:3> of the row address having the preset second logic bit set are input through the address input circuit 229, the second node n24 is driven to a logic "low" level, and the fourth node n25 is driven to a logic "high" level. At least one of the word lines included in the memory cell array (117 of FIG. 2) may be selected by the second word line selection signal WLSB2 driven to a logic "low" level.

The address input circuit 229 may include a first boosting circuit (BST CIR(1)) 231, a second boosting circuit (BST CIR(2)) 233, a first NMOS transistor 27_5, a fourth NMOS transistor 27_6, a second NMOS transistor 27_7, and a third NMOS transistor 27_8.

The first boosting circuit 231 may boost the first bit RADD<1> of the row address to generate a first boosting address BSTA1. The first boosting address BSTA1 may be generated at a higher voltage level than the first bit RADD<1> of the row address. For example, the first boosting circuit 231 may generate the first boosting address BSTA1 having the same logic level as the first bit RADD<1> of the row address.

The second boosting circuit 233 may boost a first bit RADB<1> of an inverted row address to generate a second boosting address BSTA2. The first bit RADB<1> of the inverted row address may be generate by inverting the first bit RADD<1> of the row address. The second boosting address BSTA2 may be generated to have a higher voltage level than the first bit RADB<1> of the inverted row address. For example, the second boosting circuit 233 may generate the second boosting address BSTA2 having the same logic level as the first bit RADB<1> of the inverted row address.

The first NMOS transistor 27_5 may be connected between the first node n21 and the fifth node n27, and may be turned-on based on the first boosting address BSTA1. For example, the first NMOS transistor 27_5 may be turned-on by the first boosting address BSTA1 generated at a logic "high" level when the first bit RADD<1> of the row address is at a logic "high" level. The fourth NMOS transistor 27_6 may be connected between the second node n24 and the fifth node n27, and may be turned-on based on the second boosting address BSTA2. For example, the fourth NMOS transistor 27_6 may be turned-on by the second boosting address BSTA2 generated at a logic "high" level when the first bit RADB<1> of the inverted row address is at a logic "high" level. The second NMOS transistor 27_7 may be connected between the fifth node n27 and a sixth node n28, and may be turned-on based on the second bit RADD<2> of the row address. For example, the second NMOS transistor 27_7 may be turned-on when the second bit RADD<2> of the row address is at a logic "high" level. The third NMOS transistor 27_8 may be connected between the sixth node n28 and the supply terminal of the ground voltage VSS, and may be turned-on based on the third bit RADD<3> of the row address. For example, the third NMOS transistor 27_8 may be turned-on when the third bit RADD<3> of the row address is at a logic "high" level.

Each of the first NMOS transistor 27_5 and the fourth NMOS transistor 27_6 may be formed to include a thicker gate oxide layer than each of the second NMOS transistor 27_7 and the third NMOS transistor 27_8, or may be formed to include a gate oxide layer having a high dielectric constant. Because a threshold voltage of each of the first NMOS transistor 27_5 and the fourth NMOS transistor 27_6 may be set to be greater than a threshold voltage of each of the second NMOS transistor 27_7 and the third NMOS transistor 27_8, a leakage current generated in each of the turned-off first NMOS transistor 27_5 and fourth NMOS transistor 27_6 may be reduced. The first NMOS transistor 27_5 may be turned-on by the first boosting address BSTA1 generated at a higher voltage level than the first bit RADD<1> of the row address, and the fourth NMOS transistor 27_6 may be turned-on by the second boosting address BSTA2 generated at a higher voltage level than the first bit RADB<1> of the inverted row address. Accordingly, a sufficient gate voltage can be secured even in a low-speed operation state, so that the turn-on timing can be prevented from being delayed and a timing difference between the row operation and the column operation can be sufficiently secured to prevent deterioration of the row operation and the column operation.

The address input circuit 229 may drive the first node n21 to a logic "low" level when the first to third bits RADD<1:3> of the row address have the preset first logic bit set. For example, in the preset first logic bit set of the first to third bits RADD<1:3> of the row address, the first bit RADD<1> of the row address, the second bit RADD<2> of the row address, and the third bit RADD<3> of the row address may all be set to a logic "high" level, but this is only an example and the present disclosure is not limited thereto. The address input circuit 229 may drive the second node n24 to a logic "low" level when the first to third bits RADD<1:3> of the row address have the preset second logic bit set. For example, in the preset second logic bit set of the first to third bits RADD<1:3> of the row address, the first bit RADD<1> of the row address may be set to a logic "low" level, and the second bit RADD<2> of the row address and the third bit RADD<3> of the row address may be both set to a logic "high" level, but this is only an example and the present disclosure is not limited thereto.

Figure 5:
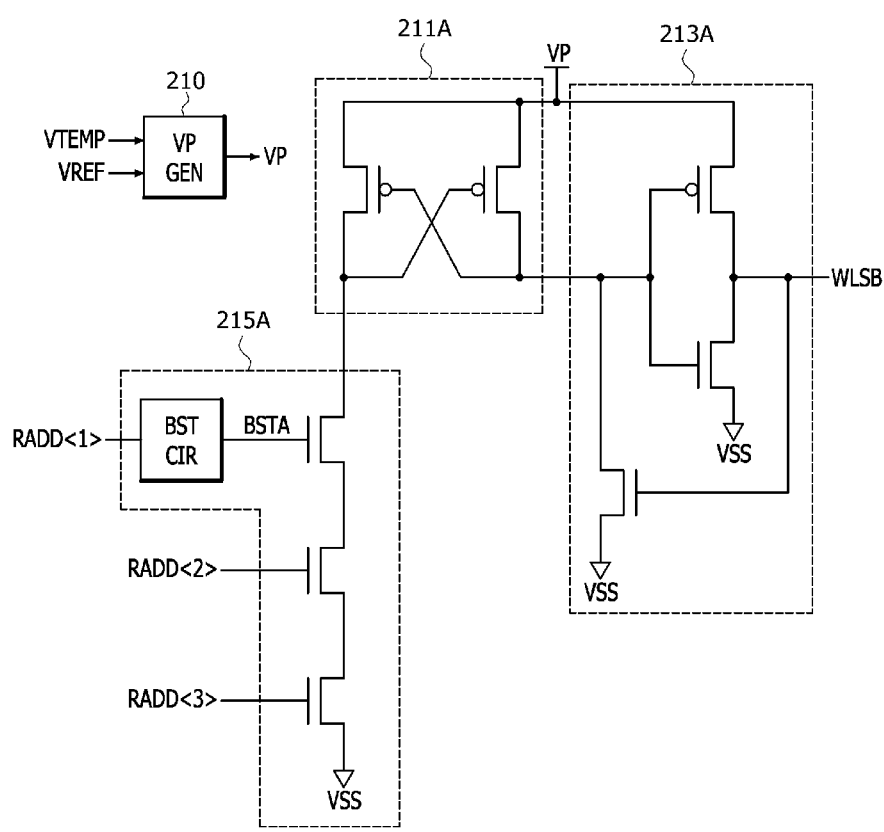
FIG. 5 is a diagram illustrating a configuration of a row decoder according to yet another embodiment of the present disclosure.

FIG. 5 is a diagram illustrating a configuration of a row decoder 115C according to yet another embodiment of the present disclosure. As illustrated in FIG. 5, the row decoder 115C may include a source power generation circuit (VP GEN) 210, a voltage setting circuit 211A, a word line selection signal generation circuit 213A, and an address input circuit 215A.

The source power generation circuit 210 may generate source power VP based on a temperature voltage VTEMP and a reference voltage VREF. The temperature voltage VTEMP may set to have a voltage level that varies according to temperature. For example, the temperature voltage VTEMP may be set to have a higher voltage level as the temperature decreases, and may be set to have a lower voltage level as the temperature increases. The reference voltage VREF may be set to have a voltage level for dividing the voltage level section of the temperature voltage VTEMP into a low-temperature state and a high-temperature state. For example, in a low temperature state, the temperature voltage VTEMP may be set to have a higher voltage level than the reference voltage VREF, and in a high-temperature state, the temperature voltage VTEMP may be set to have a voltage level lower than or equal to a voltage level of the reference voltage VREF. The source power generation circuit 210 may generate the source power VP having a higher voltage level in the low-temperature state than in the high-temperature state. The more detailed configuration and operation of the source power generation circuit 210 will be described later with reference to FIGS. 6 to 8.

Because the voltage setting circuit 211A, the word line selection signal generation circuit 213A, and the address input circuit 215A may be implemented in the same way as the voltage setting circuit 211, the word line selection signal generation circuit 213, and the address input circuit 215 illustrated in FIG. 3, respectively, detailed descriptions for the configuration and operation will be omitted here.

The row decoder 115C may include the source power generation circuit 210 to drive the word line in the low-temperature state, based on the source power having a higher voltage level than that in the high-temperature state. Accordingly, there is also an effect of preventing deterioration of the row operation and column operation by sufficiently securing a timing difference between the row operation and the column operation in a low-temperature state.

Figure 6:
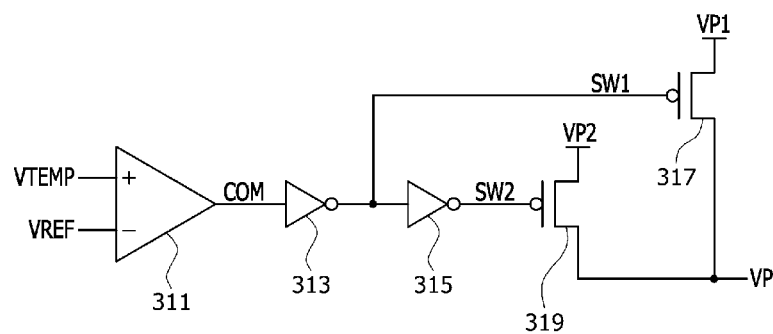
FIG. 6 is a circuit diagram of a source power generation circuit according to an embodiment of the present disclosure.

FIG. 6 is a diagram illustrating a source power generation circuit 210A according to an embodiment of the present disclosure. As illustrated in FIG. 6, the source power generation circuit 210A may include a comparator 311, inverters 313 and 315, and PMOS transistors 317 and 319.

The comparator 311 may compare a temperature voltage VTEMP and a reference voltage VREF to generate a comparison signal COM. The comparator 311 may generate the comparison voltage COM of a logic "high" level when the temperature voltage VTEMP has a higher voltage level than the reference voltage VREF in a low-temperature state. The comparator 311 may generate the comparison signal COM of a logic "low" level when the temperature voltage VTEMP has a voltage level equal to or less than a voltage level of the reference voltage VREF in a high-temperature state.

The inverter 313 may inversely buffer the comparison signal COM to generate a first switching signal SW1. The inverter 315 may inversely buffer the first switching signal SW1 to generate a second switching signal SW2. The PMOS transistor 317 may be turned-on based on the first switching signal SW1 to drive a source power VP to a first source power VP1. The PMOS transistor 319 may be turned-on based on the second switching signal SW2 to drive the source power VP to a second source power VP2. The first source power VP1 may be set to have a higher voltage level than the second source power VP2. For example, the second source power VP2 may be set to a power voltage (not shown) supplied from the controller (11 in FIG. 1), and the first source power VP1 may be set to have a voltage level higher than the power voltage (not shown) and lower than the temperature voltage VTEMP. Because the PMOS transistor 317 is turned-on in a low-temperature state to drive the source power VP to the first source power VP1 and the PMOS transistor 319 is turned-on in a high-temperature state to drive the source power VP to the second source power VP2, the source power VP may be driven to a higher voltage level in the low-temperature state than in the high-temperature state.

Figure 7:
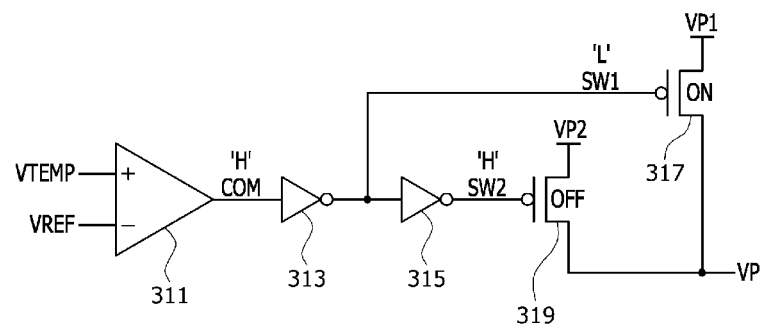
FIGS. 7 and 8 are circuit diagrams illustrating an operation of the source power generation circuit illustrated in FIG. 6.
Figure 8:
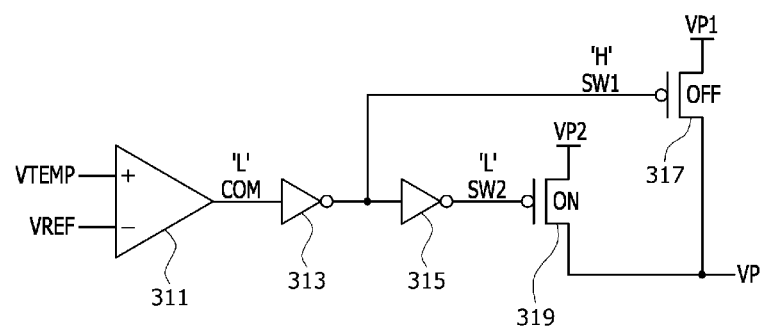

FIGS. 7 and 8 are circuit diagrams illustrating an operation of the source power generation circuit 210A illustrated in FIG. 6. The operation of the source power generation circuit 210A is divided into an operation in a low-temperature state and an operation in a high-temperature state and will be described as follows with reference to FIGS. 7 and 8.

As illustrated in FIG. 7, because the temperature voltage VTEMP has a higher voltage level than the reference voltage VREF in the low-temperature state, the comparison signal COM may be generated at a logic "high" level 'H', the first switching signal SW1 may be generated at a logic "low"

level 'L', and the second switching signal SW2 may be generated at a logic "high" level 'H'. Because the PMOS transistor 317 is turned-on by the first switching signal SW1 of the logic "low" level 'L', the source power VP may be driven to the first source power VP1.

As illustrated in FIG. 8, because the temperature voltage VTEMP has a voltage level equal to or less than a voltage level of the reference voltage VREF in the high-temperature state, the comparison signal COM may be generated at a logic "low" level 'L', the first switching signal SW1 may be generated at a logic "high" level 'H', and the second switching signal SW2 may be generated at a logic "low" level 'L'. Because the PMOS transistor 319 is turned-on by the second switching signal SW2 of the logic "low" level 'L', the source power VP may be driven to the second source power VP2.

Figure 9:
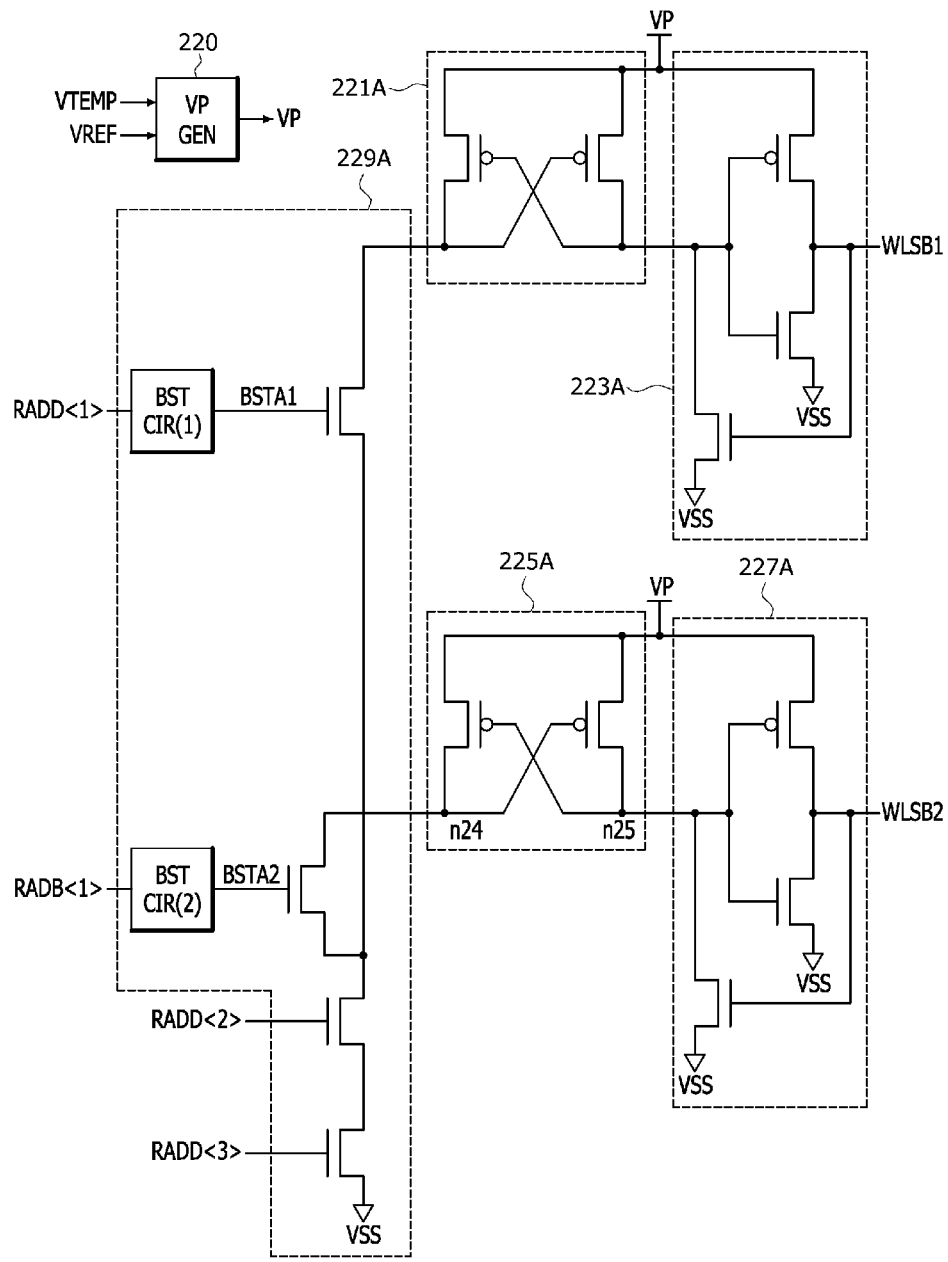
FIG. 9 is a diagram illustrating a configuration of a row decoder according to still yet another embodiment of the present disclosure.

FIG. 9 is a diagram illustrating a configuration of a row decoder 115D according to still yet another embodiment of the present disclosure. As illustrated in FIG. 9, the row decoder 115D may include a source power generation circuit (VP GEN) 220, a first voltage setting circuit 221A, a first word line selection signal generation circuit 223A, a second voltage setting circuit 225A, a second word line selection signal generation circuit 227A, and an address input circuit 229A.

The source power generation circuit 220 may generate a source power VP, based on a temperature voltage VTEMP and a reference voltage VREF. The temperature voltage VTEMP may be set to have a voltage level that varies according to temperature. For example, the temperature voltage VTEMP may be set to have a higher voltage level as the temperature decreases, and may be set to have a lower voltage level as the temperature increases. The reference voltage VREF may be set to have a voltage level for dividing the voltage level section of the temperature voltage VTEMP into a low-temperature state and a high-temperature state. For example, in the low-temperature state, the temperature voltage VTEMP may be set to have a higher voltage level than the reference voltage VREF, and in the high-temperature state, the temperature voltage VTEMP may be set to have a voltage level less than or equal to a voltage level of the reference voltage VREF. The source power generation circuit 210 may generate the source power VP having a higher voltage level in the low-temperature state than in the high-temperature state.

Because the first voltage setting circuit 221A, the first word line selection signal generation circuit 223A, the second voltage setting circuit 225A, the second word line selection signal generation circuit 227A, and the address input circuit 229A may be implemented in the same way as the voltage setting circuit 211, the first word line selection signal generation circuit 223, the second voltage setting circuit 225, the second word line selection signal generation circuit 227, and the address input circuit 229 illustrated in FIG. 3, respectively, detailed descriptions for the configuration and operation will be omitted here.

The row decoder 115D may include the source power generation circuit 220 to drive the word line, based on the source power having a higher voltage level in the low temperature state than that in the high-temperature state. Accordingly, there is also an effect of preventing deterioration of the row operation and column operation by sufficiently securing a timing difference between the row operation and the column operation in a low-temperature state.

Figure 10:
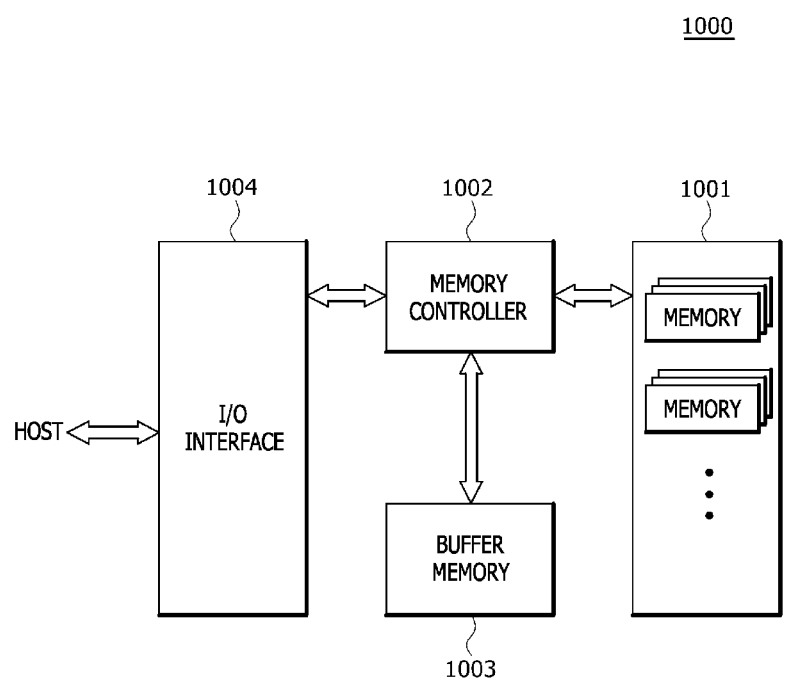
FIG. 10 is a block diagram illustrating a configuration of an electronic system according to an embodiment of the present disclosure.

The semiconductor device 13 described above with reference to FIG. 1 and the semiconductor device 13A described above with reference to FIG. 2 may be applied to electronic systems including a memory system, a graphic system, a computing system, a mobile system, or the like. For example, referring to FIG. 10, an electronic system 1000 according to an embodiment of the present disclosure may include a data storage unit 1001, a memory controller 1002, buffer memory 1003, and an input/output interface 1004.

The data storage unit 1001 may store data applied from the memory controller 1002 and read stored data to output the data to the memory controller 1002 according to a control signal from the memory controller 1002. The data storage unit 1001 may include the semiconductor device 13 described above with reference to FIG. 1 or the semiconductor device 13A described above with reference to FIG. 2. Meanwhile, the data storage unit 1001 may include a nonvolatile memory capable of continuously storing data without losing data even when power is cut off. The nonvolatile memory may be implemented with a flash memory device using, for example, NOR flash memory and NAND flash memory, phase change random access memory (PRAM), resistive random access memory (RRAM), spin transfer torque random access memory (STTRAM), and magnetic random access memory (MRAM).

The memory controller 1002 may decode a command applied from an external device (host device) through the input/output interface 1004, and control data input/output of the data storage unit 1001 and the buffer memory 1003 according to a decoding result. Although the memory controller 1002 is illustrated as one block in FIG. 10, the memory controller 1002 may include a controller for controlling the data storage unit 1001 and a controller for controlling the buffer memory 1003, which is volatile memory, independently. The memory controller 1002 may include the controller 11 described above with reference to FIG. 1.

The buffer memory 1003 may temporarily store data to be processed by the memory controller 1002, that is, data input/output to/from the data storage unit 1001. The buffer memory 1003 may store data DATA applied from the memory controller 1002 according to a control signal. The buffer memory 1003 may read the stored data and outputs the same to the memory controller 1002. The buffer memory 1003 may include volatile memory such as dynamic random access memory (DRAM), mobile DRAM, static random access memory (SRAM), or the like.

The input/output interface 1004 may provide a physical connection between the memory controller 1002 and an external device (host) to enable the memory controller 1002 to receive a control signal for data input/output from the external device and to exchange data with the external device. The input/output interface 1004 may include one of various interface protocols such as USB, MMC, PCI-E, SAS, SATA, PATA, SCSI, ESDI, IDE, or the like.

The electronic system 1000 may be used as an auxiliary storage device of the host device or an external storage device. The electronic system 1000 may include a solid state disk (SSD), a universal serial bus memory, a secure digital (SD), a mini secure digital card (mSD), a micro secure digital card (micro SD), a secure digital high capacity (SDHC), a memory stick card, a smart media card (SM), a multi-media card (MMC), an embedded MMC (eMMC), a compact flash (CF), or the like.

Figure 11:
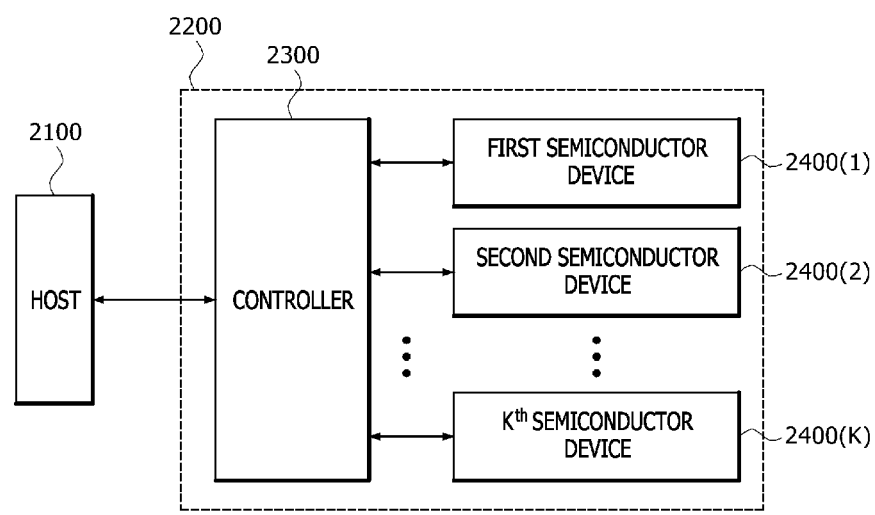
FIG. 11 is a block diagram illustrating a configuration of an electronic system according to another embodiment of the present disclosure.

FIG. 11 is a block diagram illustrating a configuration of an electronic system 2000 according to another embodiment of the present disclosure. As illustrated in FIG. 11, the electronic system 2000 may include a host 2100 and a semiconductor system 2200.

The host 2100 and the semiconductor system 2200 may transmit signals to each other using an interface protocol. The interface protocol used between the host 2100 and the semiconductor system 2200 may include multi-media card (MMC), enhanced small disk interface (ESDI), integrated drive electronics (IDE), peripheral component Interconnect-express (PCI-E), advanced technology attachment (ATA), serial ATA (SATA), parallel ATA (PATA), serial attached SCSI (SAS), universal serial bus (USB), or the like.

The semiconductor system 2200 may include a controller 2300 and semiconductor devices 2400(1:K). The controller 2300 may control the semiconductor devices 2400(1:K) to perform an active operation, a read operation, and a write operation. Each of the semiconductor devices 2400(1:K) may apply the boosting address (BSTA of FIGS. 3 and 5, BSTA1 and BSTA2 of FIGS. 4 and 9) generated through the boosting circuit (217 of FIGS. 3 and 5, 231 and 233 of FIGS. 4 and 9) to the NMOS transistor (23_3 of FIGS. 3 and 5, 27_5 and 27_6 of FIGS. 4 and 9) of the address input circuit (215 of FIGS. 3 and 5, and 229 of FIGS. 4 and 9), so that the timing of turning-on the MOS transistor can be prevented from being delayed due to the boosting address (BSTA of FIGS. 3 and 5, BSTA1 and BSTA2 of FIGS. 4 and 9) and the timing difference between the row operation and the column operation is sufficiently secured to prevent deterioration of the row operation and the column operation, even if the threshold voltage of the MOS transistor (23_3 of FIGS. 3 and 5, 27_5 and 27_6 of FIGS. 4 and 9) is increased.

The controller 2300 may be implemented as the controller 11 described above with reference to FIG. 1. Each of the semiconductor devices 2400(1:K) may be implemented as the semiconductor device 13 described above with reference to FIG. 1 or the semiconductor device 13A described above with reference to FIG. 2. Each of the semiconductor devices 2400(1:K) may be implemented with one of dynamic random access memory (DRAM), phase change random access memory (PRAM), resistive random access memory (RRAM), magnetic random access memory (MRAM), and ferroelectric random access memory (FRAM).

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of the distinctive features in the equivalent scope should be construed as being included in the concepts.

What is claimed is:

1. A semiconductor device comprising:
an address input circuit configured to boost a voltage level of at least one bit of a row address to generate a boosting address and to drive a signal of a first node based on other bits of the row address and the boosting address;
a word line selection signal generation circuit configured to drive a signal of a second node based on the signal of the first node and to generate a word line selection signal for selecting a word line based on the signal of the second node; and
a voltage setting circuit configured to drive the signal of the second node based on the signal of the first node, and drive the signal of the first node based on the signal of the second node.

2. The semiconductor device of claim 1, wherein the address input circuit is configured to generate the boosting address to have a higher voltage level than at least one bit of the row address.

3. The semiconductor device of claim 1, wherein the row address includes first, second, and third bits, and
wherein the address input circuit includes:
a boosting circuit configured to boost the first bit of the row address to generate the boosting address; and
a first NMOS transistor configured to be turned-on based on the boosting address.

4. The semiconductor device of claim 3, wherein the first NMOS transistor is connected between the first node and a third node,
wherein the address input circuit further includes a second NMOS transistor and a third NMOS transistor that are connected in series between the third node and a supply terminal of a ground voltage,
wherein the second NMOS transistor is turned-on based on the second bit of the row address, and
wherein the third NMOS transistor is turned-on based on the third bit of the row address.

5. The semiconductor device of claim 4, wherein the first NMOS transistor includes at least one of:
a thicker gate oxide layer than each of the second NMOS transistor and the third NMOS transistor; and
a gate oxide layer having a higher dielectric constant than each of the second NMOS transistor and the third NMOS transistor.

6. The semiconductor device of claim 1, wherein the word line selection signal generation circuit is configured to:
drive the word line selection signal based on the signal of the second node; and
initialize the second node based on the word line selection signal.

7. The semiconductor device of claim 1, further comprising a source power generation circuit configured to generate source power to have a higher voltage level in a low-temperature state than in a high-temperature state.

8. The semiconductor device of claim 7, wherein the word line selection signal generation circuit is configured to drive the word line selection signal to the source power based on the signal of the second node.

9. A semiconductor device comprising:
an address input circuit configured to generate a first boosting address and a second boosting address based on at least one bit of a row address, to drive a signal of a first node based on other bits of the row address and the first boosting address, and to drive a signal of a second node based on other bits of the row address and the second boosting address;
a first word line selection signal generation circuit configured to drive a signal of a third node based on the signal of the first node and to generate a first word line selection signal for selecting a first word line based on the signal of the third node; and
a second word line selection signal generation circuit configured to drive a signal of a fourth node based on the signal of the second node and to generate a second word line selection signal for selecting a second word line based on the signal of the fourth node.

10. The semiconductor device of claim 9, wherein the address input circuit is configured to generate the first boosting address and the second boosting address to each have a higher voltage level than at least one bit of the row address.

11. The semiconductor device of claim 9, wherein the row address includes first, second, and third bits, and
wherein the address input circuit includes:
a first boosting circuit configured to boost the first bit of the row address to generate the first boosting address; and
a first NMOS transistor configured to be turned-on based on the first boosting address.

12. The semiconductor device of claim 11,
wherein the first NMOS transistor is connected between the first node and a fifth node,
wherein the address input circuit further includes a second NMOS transistor and a third NMOS transistor that are connected in series between the fifth node and a supply terminal of a ground voltage,
wherein the second NMOS transistor is turned-on based on the second bit of the row address, and
wherein the third NMOS transistor is turned-on based on the third bit of the row address.

13. The semiconductor device of claim 12, wherein the first NMOS transistor includes at least one of:
a thicker gate oxide layer than each of the second NMOS transistor and the third NMOS transistor; and
a gate oxide layer having a higher dielectric constant than each of the second NMOS transistor and the third NMOS transistor.

14. The semiconductor device of claim 9, wherein the row address includes first, second, and third bits, and
wherein the address input circuit includes:
a second boosting circuit configured to boost a first bit of an inverted row address obtained by inversely buffering the first bit of the row address to generate the second boosting address; and
a fourth NMOS transistor configured to be turned-on based on the second boosting address.

15. The semiconductor device of claim 14, wherein the fourth NMOS transistor is connected between the second node and a fifth node, and
wherein the address input circuit further includes a second NMOS transistor and a third NMOS transistor that are connected in series between the fifth node and a supply terminal of a ground voltage,
wherein the second NMOS transistor is turned-on based on the second bit of the row address, and
wherein the third NMOS transistor is turned-on based on the third bit of the row address.

16. The semiconductor device of claim 9, further comprising a first voltage setting circuit configured to:
drive a signal of the third node based on the signal of the first node; and
drive the signal of the first node based on the signal of the third node.

17. The semiconductor device of claim 9, further comprising a second voltage setting circuit configured to:
drive a signal of the fourth node based on the signal of the second node; and
drive the signal of the second node based on the signal of the fourth node.

18. The semiconductor device of claim 9, wherein the first word line selection signal generation circuit is configured to:
drive the first word line selection signal based on the signal of the third node; and
initialize the third node based on the first word line selection signal.

19. The semiconductor device of claim 9, wherein the second word line selection signal generation circuit is configured to:
drive the second word line selection signal based on the signal of the fourth node; and
initialize the fourth node based on the second word line selection signal.

20. The semiconductor device of claim 9, further comprising a source power generation circuit configured to generate source power to have a higher voltage level in a low-temperature state than in a high-temperature state.

21. The semiconductor device of claim 20, wherein the first word line selection signal generation circuit is configured to drive the first word line selection signal to the source power based on the signal of the third node.

22. A semiconductor system comprising:
a controller configured to output an external control signal; and
a semiconductor device configured to:
boost a voltage level of at least one bit of a row address generated based on the external control signal to generate a boosting address,
drive a signal of a first node based on other bits of the row address and the boosting address,
drive a signal of a second node based on the signal of the first node,
drive the signal of the first node based on the signal of the second node, and
generate a word line selection signal for selecting a word line based on the signal of the second node.

23. The semiconductor system of claim 22, wherein the controller is configured to apply the external control signal to the semiconductor device, and
wherein the semiconductor device is configured to decode the external control signal to generate an active signal and the row address for a row operation.

* * * * *